(12) United States Patent
Lukanc et al.

(10) Patent No.: US 6,383,827 B1
(45) Date of Patent: May 7, 2002

(54) ELECTRICAL ALIGNMENT TEST STRUCTURE USING LOCAL INTERCONNECT LADDER RESISTOR

(75) Inventors: Todd Lukanc, San Jose; Asim Selcuk, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/551,626

(22) Filed: Apr. 17, 2000

(51) Int. Cl.$^7$ ............................................. H01L 21/66
(52) U.S. Cl. ........................................ 438/18; 257/48
(58) Field of Search ............................. 438/18, 14–17, 438/5, 2–13; 257/48, 798

(56) References Cited

U.S. PATENT DOCUMENTS 5,857,258 A * 1/1999 Penzes et al. ................. 29/846

OTHER PUBLICATIONS

IBM Technical Disclosure Bulletin, Apr. 1989, US "Using Capacitance Measurements to Localize the Positions of Opens in Serpentine Metal Lines" Apr. 1, 1989.*

* cited by examiner

Primary Examiner—Keith Christianson
Assistant Examiner—Craig Thompson (57) ABSTRACT

An electrical alignment test structure is provided that enables accurate in-process alignment measurements. Embodiments include forming two conductive layers whose alignment is be tested on the surface of a semiconductor substrate, one layer having a generally trapezoidal "shorting bar" with symmetrically stepped sides, and the other layer having a snake-like resistor "sladder" with two symmetrical sets of rung-like segments, whose ends correspond to the steps of the sides of the shorting bar. The ladder and the shorting bar are disposed with the shorting bar between the two sets of segments of the ladder, such that when the two layers are formed properly aligned, an equal number of segments of each set of segments of the ladder makes contact with the shorting bar. Thus, when the two layers are properly aligned, the resistance of each of the two sets of segments of the ladder is about the same. However, when the layers are out of alignment more than a predetermined amount (i.e., the depth of a step of the shorting bar), a different number of segments short to the respective sides of the shorting bar, resulting in each set of segments having a different resistance measured at their ends. Since the resistance of each segment is significant (e.g., over 100 ohms), the resistance difference and, hence, the number of shorted segments on each side can be accurately calculated. Then, knowing the spacing of each step of the shorting bar, the alignment offset of the two layers can be calculated. Furthermore, by comparing the drawn separation of the ladder and the shorting bar with the calculated separation of these components of the actual test structure, quick and accurate measurement of critical dimension (CD) variation is provided.

16 Claims, 6 Drawing Sheets

ELECTRICAL ALIGNMENT TEST STRUCTURE USING LOCAL INTERCONNECT LADDER RESISTOR

FIELD OF THE INVENTION

The present invention relates to a test structure and methodology for determining the alignment of layers formed on a semiconductor substrate. The present invention has particular applicability in manufacturing semiconductor devices having submicron features.

BACKGROUND ART

Semiconductor devices are conventionally manufactured by photolithographically forming a series of layers sequentially on a semiconductor substrate. For example, a patterned conductive polysilicon layer is typically formed to make electrical contact with active regions previously formed in the substrate, then a local interconnect (LI) is formed to selectively make electrical contact with the polysilicon layer. Subsequently formed conductive layers, such as patterned metal layers, typically make contact with previously formed layers directly or through conductive vias formed in interlayer insulating films. As semiconductor design rules continue to shrink, and the photolithographic process is pushed closer to its limits, in-process inspection of alignment between photolithographically formed layers is becoming increasingly critical.

A conventional method of inspecting the alignment between consecutively formed layers, such as two metal layers, involves forming a step or "box" in the first layer, then depositing the second layer, then determining by optical inspection where the photoresist image of the second layer is located relative to the first layer as indicated by the sidewall step coverage (i.e., determining the uniformity of the sidewall step coverage on the left and right sides of the step).

This optical inspection technique has several serious shortcomings. It allows analysis of the alignment of consecutively formed layers only, thus excluding alignment analysis of two layers having one or more layers in between them; for example, LI to active layer alignment. Moreover, optical inspection cannot be used for failure analysis. Time-consuming cross-sectioning of the wafer is required to inspect the alignment of layers other than the current layer and to conduct failure analysis. Thus, it is not practical to to test a large number of wafers using this methodology. Typically, only about two wafers are tested out of a lot, thereby reducing the statistical value of the inspection. Still further, the box structure used to test alignment does not replicate actual device structures. It is significantly larger than a typical device structure, and therefore photolithographically "prints" differently than actual device structures, resulting in undesirable inaccuracies that limit the optical test's utility as device structures become ever smaller.

Figure 1:
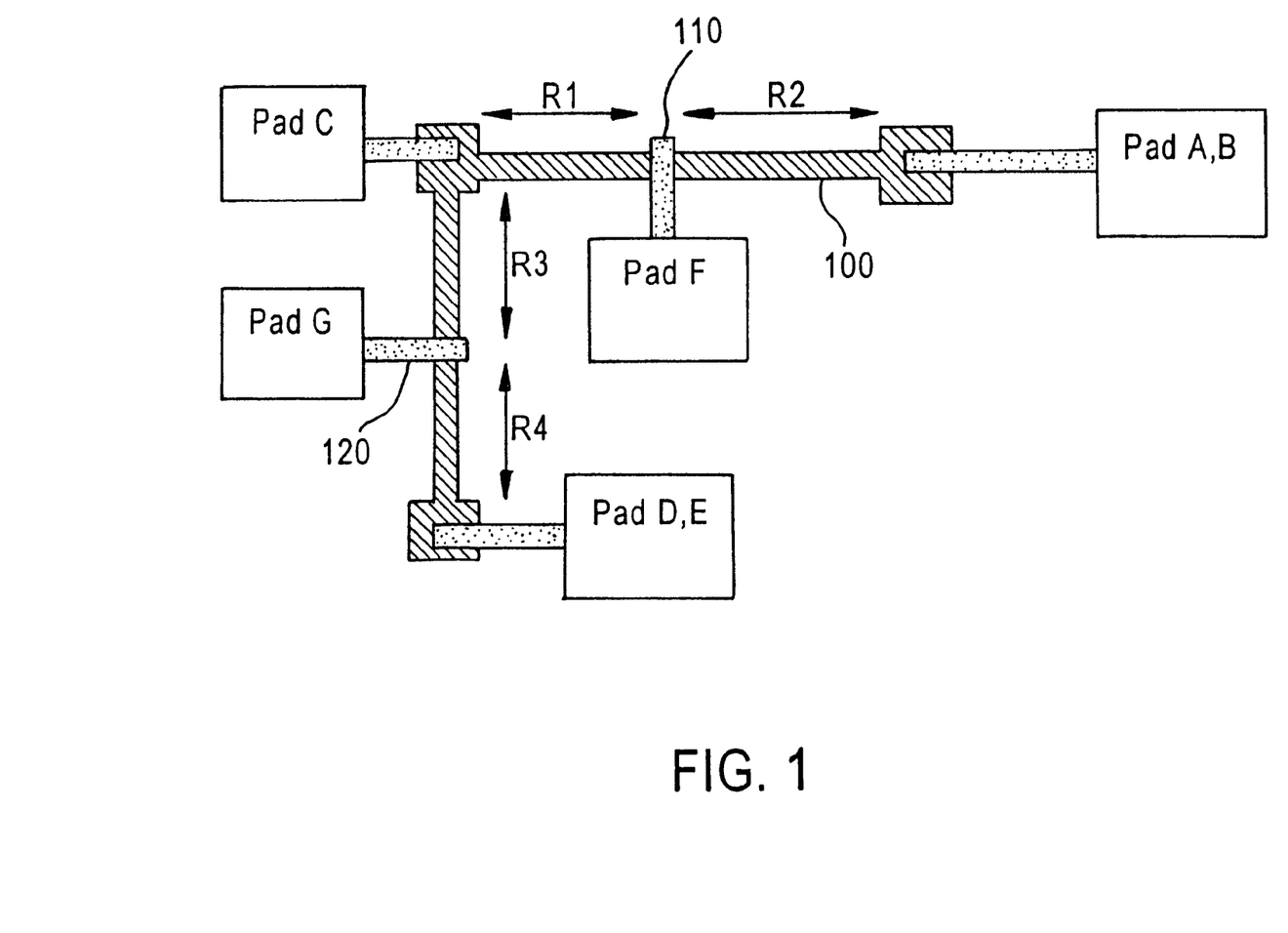
FIG. 1 schematically illustrates a conventional resistor divider alignment test structure.

To overcome the shortcomings of optical alignment tests, electrical test structures are conventionally employed, such as resistor divider type structures, as illustrated in FIG. 1. Such test structures are usually conventional Kelvin or Van der Pauw resistors, and are typically formed at multiple sites on a wafer; e.g., about 120 sites including the corners and center of each die, to check the rotational alignment of the wafer and to check stepper performance. They enable electrical alignment tests to be conducted during processing on every wafer in a lot. The resistor divider structure of FIG. 1 has an alignment-insensitive resistor 100 formed along with a first layer, such as polysilicon, and measuring points 110, 120 at the center of resistor 100 formed along with a second layer, such as an LI layer. Probes are electrically connected at pads A–G. The ratio of the polysilicon resistance R1 to R2 multiplied by the drawn length of each yields the alignment offset in the x-direction. Likewise, R3/R4 times their drawn length yields the alignment in the y-direction.

The accuracy of resistor divider type alignment structures as shown in FIG. 1 depends on the length of the resistor, the accuracy of the resistance measurement, and on design-process interactions. This type of test structure is more accurate with higher resistance films; however, resistance measurements are typically very small (i.e., fractions of an Ohm), thus limiting the accuracy of the test. The magnitude of this problem is increasing as devices are scaled and greater accuracy is required. Moreover, conventional test structures of this type require the two layers whose alignment is to be tested be in direct contact. Thus, as in optical inspection methods discussed above, only consecutive layers can be compared.

There exists a need for an electrical alignment test structure that enables every wafer to be quickly and accurately measured, and enables the alignment of non-consecutive layers to be checked.

SUMMARY OF THE INVENTION

An advantage of the present invention is an electrical alignment test structure that enables accurate alignment measurements at many sites on every wafer of a lot, and enables evaluation of the alignment of non-consecutive layers.

Additional advantages and other features of the present invention will be set forth in part in the description which follows and in part will become apparent to those having ordinary skill in the art upon examination of the following or may be learned from the practice of the invention. The advantages of the invention may be realized and obtained as particularly pointed out in the appended claims.

According to the present invention, the foregoing and other advantages are achieved in part by an electrical test structure comprising a shorting bar of a first conductive layer disposed on a semiconductor substrate, the shorting bar having a base width, a top width less than the base width, and a pair of symmetrical opposing sides, each side comprising a predetermined number of steps and joining the base width and the top width; and a pair of ladder conductors of a second conductive layer disposed on the semiconductor substrate and aligned with the first conductive layer, the ladder conductors being symmetrical to each other about a center line, each ladder conductor comprising a plurality of serially connected segments arranged corresponding to the steps of the shorting bar, each segment having an inner end adjacent to one of the steps of the shorting bar, the inner ends of the segments being equidistant from the center line; wherein the shorting bar is disposed substantially between the ladder conductors; wherein the ladder conductors are spaced apart from each other such that when the first and second conductive layers are aligned in a predetermined manner, the shorting bar is substantially axially aligned with the center line, the inner end of a predetermined segment of one of the ladder conductors makes electrical contact with one of the steps on one side of the shorting bar, and a corresponding segment of the other ladder conductor makes electrical contact with a corresponding step on the opposing side of the shorting bar; and wherein the ladder conductors are spaced apart from each other such that when the shorting bar is not substantially axially aligned with the center line, the inner end of a predetermined segment of one of the ladder conductors makes electrical contact with one of the steps on one side of the shorting bar, and a corresponding segment of the other ladder conductor does not make electrical contact with a corresponding step on the opposing side of the shorting bar.

Another aspect of the present invention is a method of determining whether first and second conductive layers formed on a semiconductor substrate are aligned in a predetermined manner, the method comprising (a) forming the first layer to have a shorting bar, the shorting bar having a base width, a top width less than the base width, and a pair of symmetrical opposing sides, each side comprising a predetermined number of steps and joining the base width and the top width; (b) forming the second layer to have a pair of ladder conductors, the ladder conductors being symmetrical to each other about a center line, each ladder conductor comprising a pair of terminals and a plurality of serially connected segments between the terminals, the segments arranged corresponding to the steps of the shorting bar, each segment having an inner end adjacent to one of the steps of the shorting bar, the inner ends of the segments being equidistant from the center line; wherein the shorting bar is formed to be substantially between the ladder conductors; wherein the ladder conductors are spaced apart from each other such that when the first and second conductive layers are aligned in the predetermined manner, the shorting bar is substantially axially aligned with the center line, the inner end of a predetermined segment of one of the ladder conductors makes electrical contact with one of the steps on one side of the shorting bar, and a corresponding segment of the other ladder conductor makes electrical contact with a corresponding step on the opposing side of the shorting bar; and wherein the ladder conductors are spaced apart from each other such that when the shorting bar is not substantially axially aligned with the center line, the inner end of a predetermined segment of one of the ladder conductors makes electrical contact with one of the steps on one side of the shorting bar, and a corresponding segment of the other ladder conductor does not make electrical contact with a corresponding step on the opposing side of the shorting bar; (c) measuring the electrical resistance of each ladder conductor between the terminals; and (d) comparing the electrical resistance of the ladder conductors to determine the alignment of the first and second layers.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional alignment test structures do not provide the required accuracy as minimum feature sizes shrink, and allow the alignment of only consecutively formed layers to be tested. The present invention addresses and solves these problems stemming from conventional alignment test structures.

According to the methodology of the present invention, two conductive layers whose alignment is to be tested are formed on the surface of a semiconductor substrate, one layer having a generally trapezoidal "shorting bar" with symmetrically stepped sides, and the other layer having a snake-like resistor "sladder" with two symmetrical sets of "rungs", whose rung ends correspond to the steps of the sides of the shorting bar. As used throughout the present disclosure and claims, the term "substrate" denotes a semiconductor substrate or an epitaxial layer formed on the semiconductor substrate. The ladder and the shorting bar are disposed with the shorting bar between the two sets of rungs of the ladder, such that when the two layers are formed properly aligned, an equal number of rungs of each set of rungs of the ladder makes contact with the shorting bar. Thus, when the two layers are properly aligned, the resistance of each of the two sets of rungs of the ladder is about the same.

However, when the layers are out of alignment more than a predetermined amount (i.e., the depth of a step of the shorting bar), a different number of rungs short to the respective sides of the shorting bar, resulting in each set of rungs having a different resistance measured at their ends. Since the resistance of each rung is significant (e.g., over 100 ohms), the resistance difference and, hence, the number of unshorted rungs on each side can be accurately calculated. Then, knowing the spacing of each step of the shorting bar, the alignment offset of the two layers can be calculated. The present invention also enables quick and accurate measurement of critical dimension (CD) variation by comparing the drawn separation of the ladder and the shorting bar with the calculated separation of these components of the actual test structure.

In other embodiments of the present invention, the shorting bar and the ladder are formed along with conductive layers that are separated by a third layer, such as a dielectric layer, and the ends of the rungs of the ladder are vias that extend through the dielectric layer to towards the shorting bar. By determining where the vias short to the shorting bar, the alignment and size of the vias are determined. Thus, the present invention allows the alignment of any two conductive layers that short together to be determined.

Figure 2:
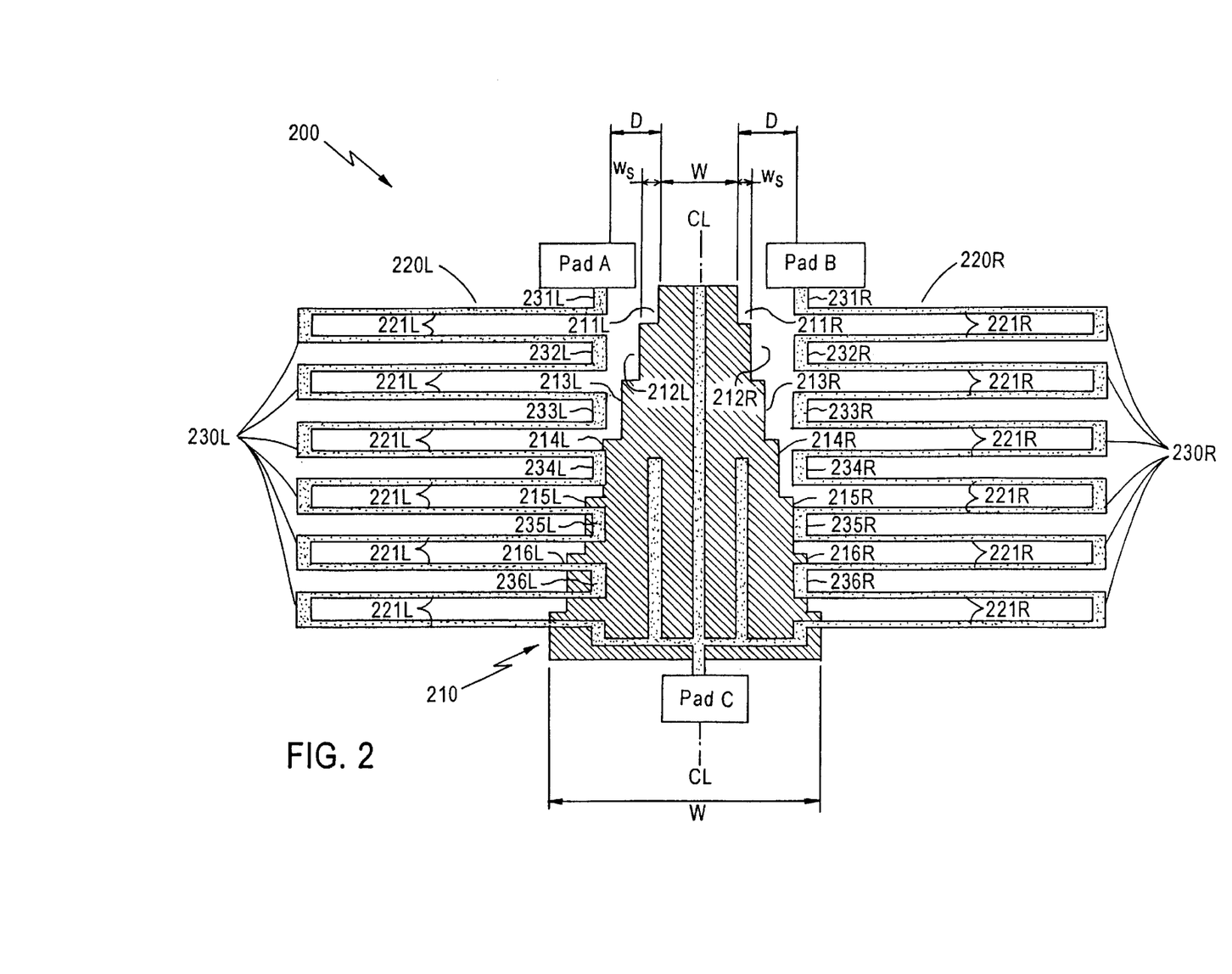
FIG. 2 is a top view of an electrical alignment test structure according to an embodiment of the present invention.

An electrical test structure according to a first embodiment of the invention is illustrated in FIG. 2. The inventive electrical test structure 200 comprises a shorting bar 210 photolithographically formed along with a first conductive layer, such as a polysilicon or metal layer, on a semiconductor substrate (not shown). Shorting bar 210 has a base width W, a top width w less than base width W, and a pair of symmetrical opposing sides, each comprising a number of steps 211L–216L and 211R–216R of equal width $w_s$ joining base width W and top width w.

A pair of ladder conductors 220L, 220R are photolithographically formed along with a second conductive layer (not shown) whose alignment with the first layer is to be inspected, such as a polysilicon layer or other conductive layer on the substrate or doped regions of the substrate. Each ladder conductor 220L, 220R comprises a plurality of serially connected segments 230L, 230R arranged corresponding to steps 211L–216L, 211R–216R of shorting bar 210. Each set of segments 230L, 230R is between a pair of terminals for contacting ladder conductors 220L, 220R to measure their electrical resistance; that is, segments 230L are between Pad A and Pad C, and segments 230R are between Pad B and Pad C. Typically, one of the terminals, such as Pad C, is common to both ladder conductors 220L, 220R.

Each segment 230L, 230R is substantially U-shaped and has a pair of legs 221L–221R and an inner end or "base" 231L–236L, 231R–236R adjacent to one of steps 211L–216L, 211R–216R of shorting bar 210. Ladder conductors 220L, 200R are symmetrical to each other about a center line CL, the inner ends 231L–236L, 231R–236R being equidistant from center line CL.

Shorting bar 210 and ladder conductors 220L, 220R are preferably formed in the "scribe line" area of a wafer; that is, the area between dies that will be scribed and sawn to separate the dies upon completion of wafer processing. Thus, the inventive test structure does not take up valuable "real estate" on the chip, and the cost of adding the inventive structure to the wafer is negligible. The size and spacing of lines of ladder conductors 220L, 220R preferably corresponds to the size and spacing of features on the remainder of the layer formed along with the ladder conductors, thereby increasing the accuracy of the test structure.

Shorting bar 210 is disposed substantially between ladder conductors 220L, 220R. Ladder conductors 220L, 220R are spaced apart from each other such that when the first and second conductive layers are aligned in a predetermined manner (i.e., substantially as designed), shorting bar 210 is substantially axially aligned with center line CL, the inner end of a predetermined segment 230L of one of the ladder conductors 220L makes electrical contact with one of the steps on one side of the shorting bar 210, and an inner end of a corresponding segment 230R of the other ladder conductor 220R makes electrical contact with a corresponding step on the opposing side of the shorting bar 210. In other words, if the first and second layers are substantially perfectly aligned, an equal number of segments of each ladder conductor 220L, 220R short to shorting bar 210.

However, as shown in FIG. 2, when shorting bar 210 is not substantially axially aligned with center line CL, the inner end of a predetermined segment 230L of one ladder conductor 220L makes electrical contact with one of the steps on one side of the shorting bar 210, and a corresponding segment 230R of the other ladder conductor 220R does not make electrical contact with the corresponding step on the opposing side of the shorting bar 210. For example, in FIG. 2, inner end 234L is in electrical contact with step 214L of shorting bar 210, but corresponding inner end 234R is not in contact with corresponding step 214R. Rather, since shorting bar 210 is not aligned with center line CL, inner end 235R contacts step 215R. In other words, a greater number of segments 230L of ladder conductor 220L contact shorting bar 210 than segments 230R of ladder conductor 220R.

Figure 4:
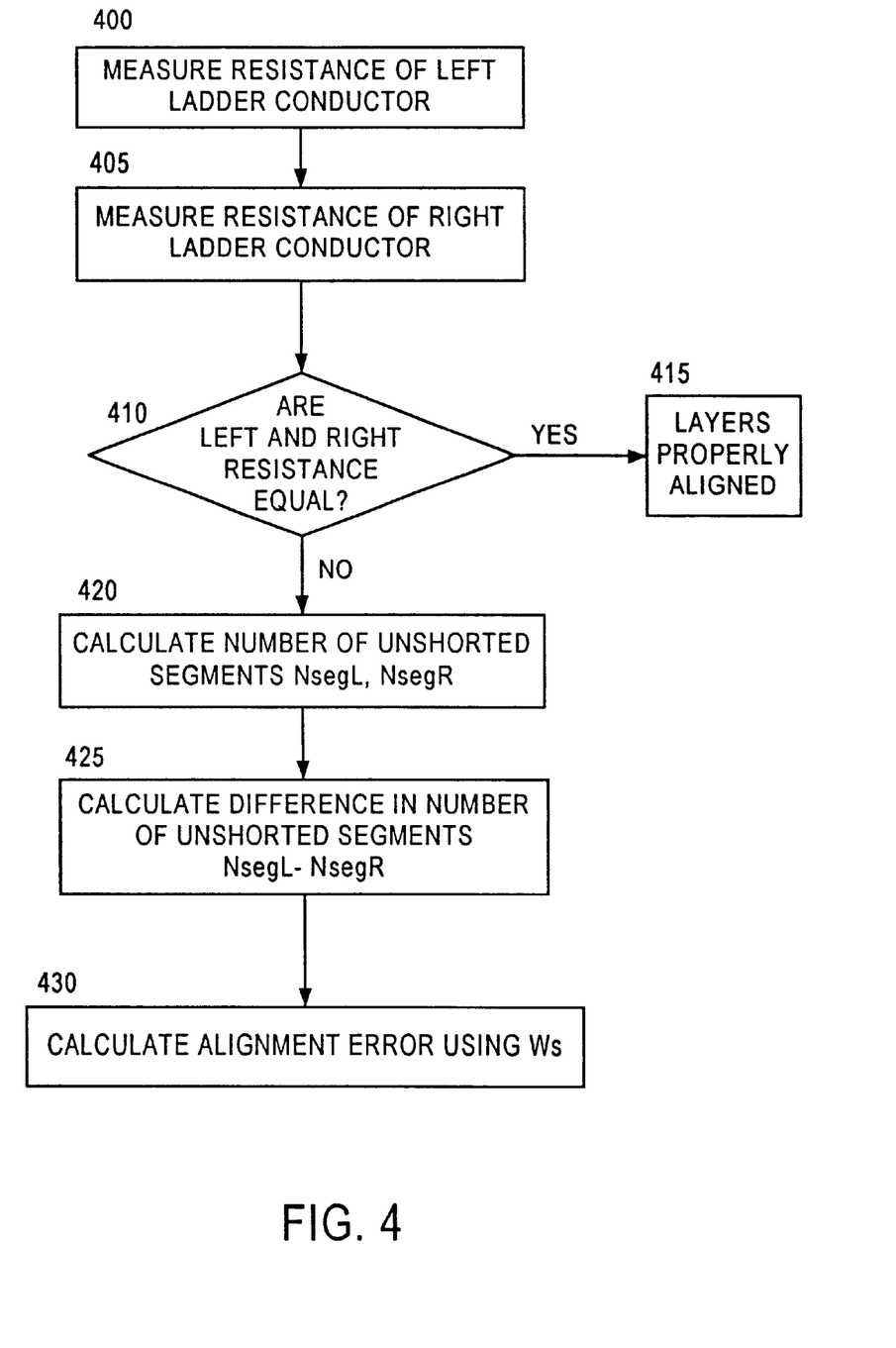
FIG. 4 is a flow chart illustrating steps of a method according to an embodiment of the present invention.

Referring to FIG. 2 and to the flow chart of FIG. 4, to measure the alignment of the first and second conductive layers, the resistance of ladder conductor 220L is measured at step 400, as with a conventional ohmmeter, between Pad A and Pad C, and the resistance of ladder conductor 220R is likewise measured at step 405 between Pad B and Pad C. The respective resistances are then compared at step 410. If the resistances are substantially equal, then shorting bar 210 is substantially aligned with center line CL; that is, shorting bar 210 is aligned within step width $w_s$, and it is determined at step 415 that the first and second conductive layers are properly aligned.

If the respective measured resistances of ladder conductors 220L, 220R are not substantially equal at step 410, it is determined that shorting bar 210 is not substantially aligned with center line CL, and the misalignment of the two layers is calculated. At step 420, the number NsegL, NsegR of unshorted segments 230L, 230R is determined based on the measured resistance of each ladder conductor 220L, 220R, the known resistance of each segment 230L, 230R and the known resistance of each step 211L–216L, 211R–216R of shorting bar 210. For example, for the structure shown in FIG. 2, which has 6 segments 230L, 230R on each side, if the measured resistance $R_{AC}$ of ladder conductor 230L between Pads A and C is 396 Ω, the measured resistance $R_{BC}$ of ladder conductor 230R between Pads B and C is 524 Ω, each segment 220L, 220R has a resistance of about 130 Ω, and each step 211L–216L, 211R–216R has a resistance of about 2 Ω, then $$R_{AC}=396 \text{ Ω}=3*130+3*2 \text{ (NsegL=3 unshorted segments 230L)} \quad (1)$$

$$R_{BC}=524 \text{ Ω}=4*130+2*2 \text{ (NsegR=4 unshorted segments 230R)} \quad (2)$$

It can be seen in FIG. 2 that the top three segments 230L are unshorted (NsegL=3) and the top four segments 230R are unshorted (NsegR=4).

The difference (NsegL–NsegR) is calculated at step 425. Next, the misalignment of shorting bar 210 and center line CL and, hence, the misalignment of the first and second conductive layers is determined using the known step width $w_s$ at step 430. If step width $w_s$ is 10 nm, then:

$$((\text{NsegL}-\text{NsegR})*w_s)/2 = \text{alignment offset to the right} = ((3-4)*10 \text{ nm})/2 = 5 \text{ nm} \quad (3)$$

The inventive test structure also enables measurement of CD variation, as long as the drawn spacing between the top of shorting bar 210 and the top of ladder conductors 220L, 220R is known; in other words, the distance D between steps 211L, 211R and inner ends 231L, 231R if shorting bar 210 was perfectly aligned with center line CL. If the spacing D was drawn as 40 nm, then:

$$((D-(\text{NsegL}*w_s))+(D-(\text{NsegR}*w_s)))/2= \quad (4)$$

$$((40 \text{ nm}-(3*10 \text{ nm}))+(40 \text{ nm}-(4*10 \text{ nm})))/2= \quad (5)$$

$$5 \text{ nm (actual to drawn CD delta)} \quad (6)$$

The accuracy of the calculation of the alignment offset and CD variation is half the step width $w_s$, since it cannot be discerned which layer (shorting bar 210 or ladder conductors 220L, 220R) is responsible for the offset or CD variation. The spacing between segments 230L, 230R and the corresponding height of steps 211L–216L, 211R–216R is preferably larger than the worst expected alignment offset in the y-direction. Another alignment structure according to this embodiment of the invention, rotated 90 degrees, is therefore preferably provided to measure alignment in the y-direction.

In an alternative embodiment of the present invention, shorting bar 210 is formed along with a metal layer, and structures shaped as electrical contacts extend from steps 211L–216L, 211R–216R toward segment ends 231L–236L, 231R–236R, formed along simultaneously with a polysilicon layer, or testing the alignment of the polysilicon layer to the metal layer.

Figure 3:
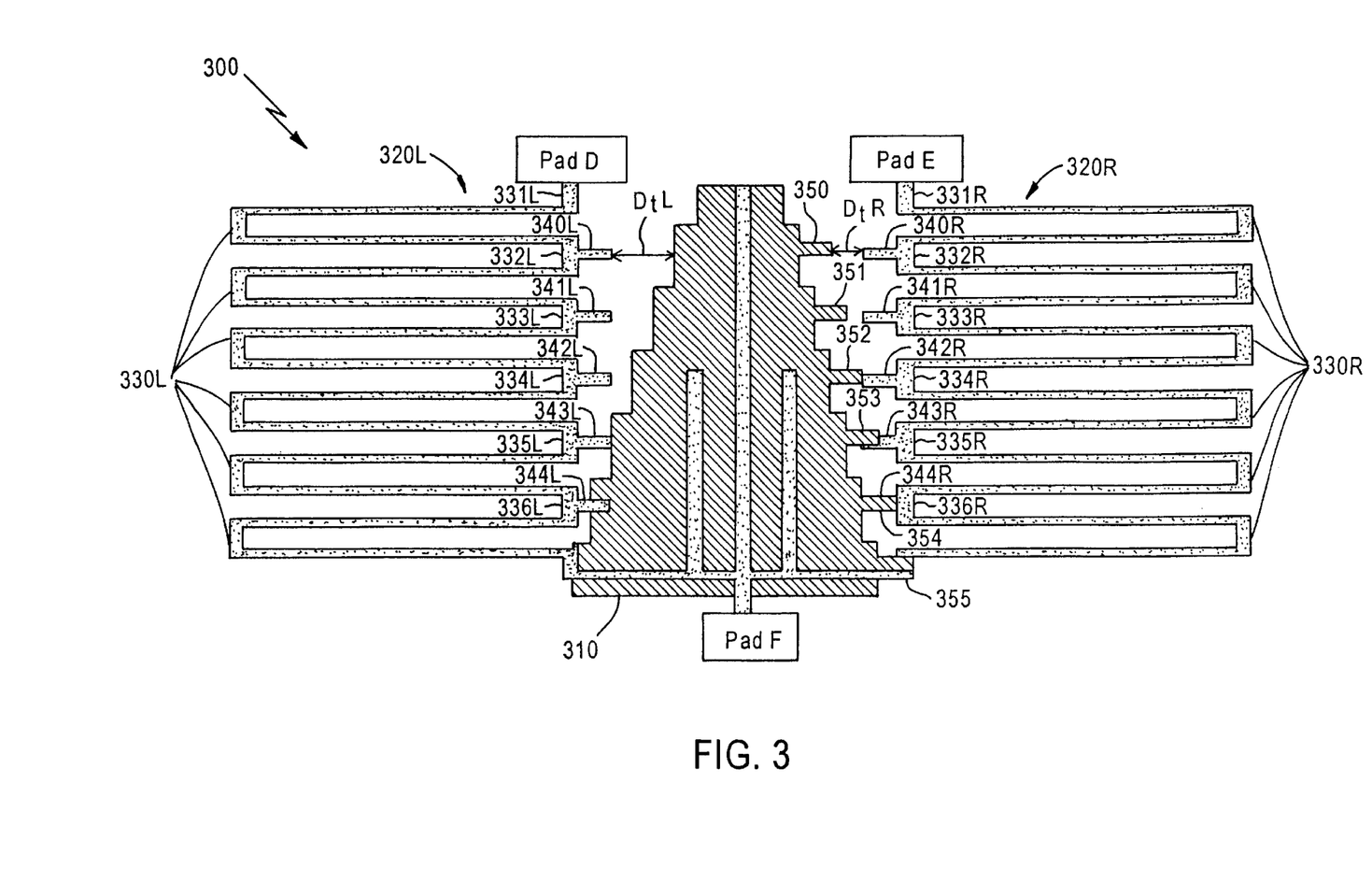
FIG. 3 is a top view of an electrical alignment test structure according to a further embodiment of the present invention.

In another embodiment of the present invention, an electrical alignment test structure is provided for measuring well-known geometric effects such as tip pullback or corner rounding, herein the end of a line or other relatively narrow structure is photolithographically printed shorter or narrower than drawn. In this embodiment, the test structure of FIG. 2 is provided on the layers to be tested, and the structure of FIG. 3 is also provided. The test structure 300 of FIG. 3 is substantially identical to that of FIG. 2, but with segment tips 340L–344L and 340R–344R extending from the bases 332L–336L, 332R–336R of segments 330L, 330R extending towards shorting bar 310. Additionally, one side of shorting bar 310 is provided with shorting bar tips 350–355 extending towards segment tips 332R–336R.

Tip pullback of the layer of the ladder conductors (220L, 220R, 320L, 320R) is calculated using a comparison of the resistance of ladder conductor 220L and ladder conductor 320L, and knowing the drawn spacing D between the top of shorting bar 210 and the top of ladder conductor 220L and the drawn spacing $D_{tL}$ between segment tip 340L and shorting bar 310. Referring now to the flow chart of FIG. 5, at step 500 the resistance of ladder conductor 220L is measured, as described above, between Pads A and C, and the resistance of ladder structure 320L is measured between Pads D and F (see step 505). Next, at step 510, the number of unshorted segments 230L (NsegL), and unshorted segments 330L (NtipL) are calculated. As calculated in equation (1) above, NsegL is 3 unshorted segments 230L. If the measured resistance of ladder conductor 320L is 524 Ω, then $$R_{DF}=524\ \Omega=4*130+2*2\ (\text{NtipL}=4\ \text{unshorted segments}\ \mathbf{330L}) \quad (7)$$

Figure 5:
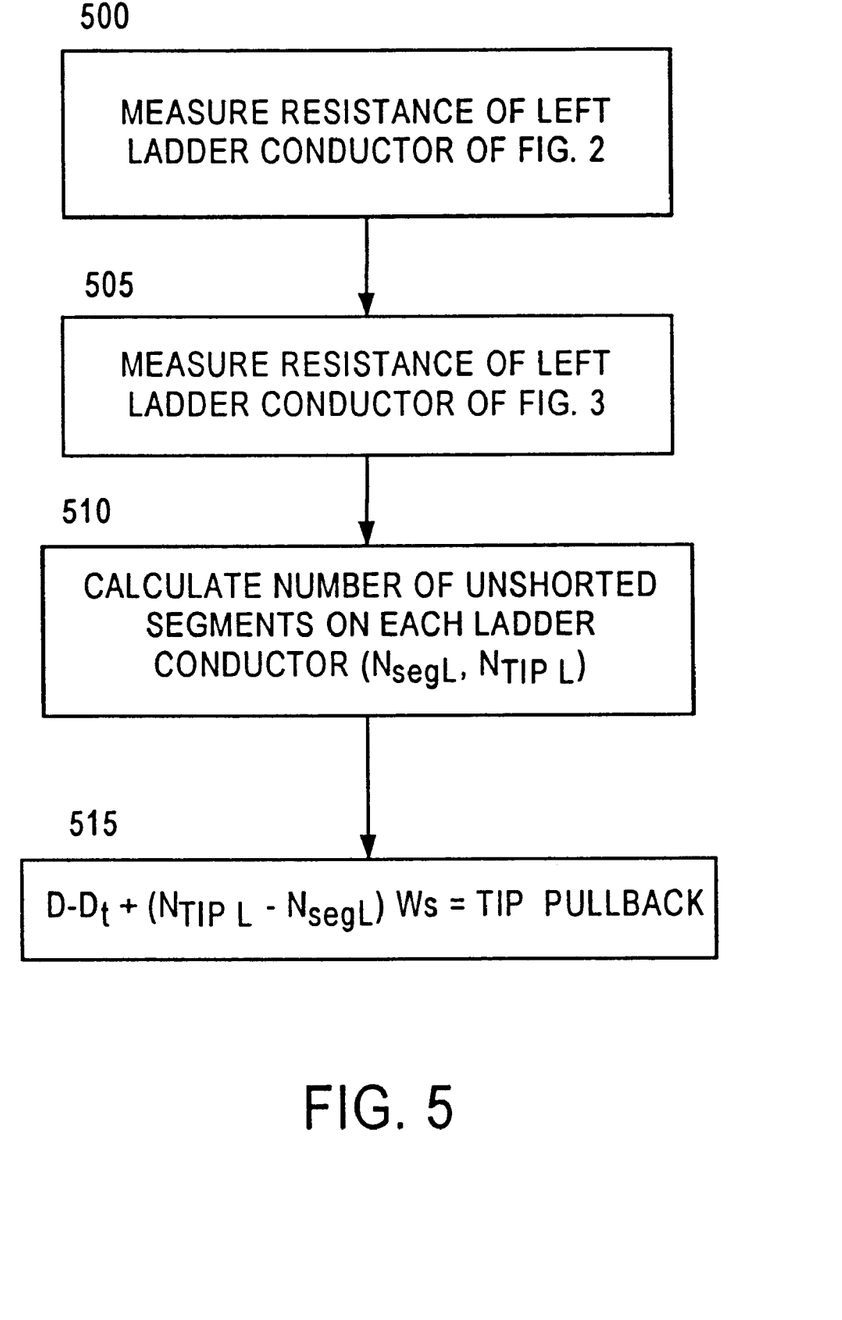
FIG. 5 is a flow chart illustrating steps of a method according to a further embodiment of the present invention.

The tip pullback is then calculated at step 515. If D is 40 nm and $w_s$ is 10 nm, as above, and DL is 10 nm, then $$D-D_{tL}+(\text{NtipL}-\text{NsegL})w_s=40\ \text{nm}-10\ \text{nm}+(4-3)10\ \text{nm}=40\ \text{nm tip pullback} \quad (8)$$

The same steps 500–515 are carried out for the right side of FIGS. 2 and 3 to calculate the combined pullback of segment tips 340R–344R and shorting bar tips 350–355, using the top tip spacing DR. As calculated in equation (2) above, NsegR is 4 unshorted segments 230R. If the measured resistance of ladder conductor 320R between Pads E and F is 396 Ω, then $$R_{EF}=652\ \Omega=5*130+1*2\ (\text{NtipR}=5\ \text{unshorted segments}\ \mathbf{330R}) \quad (9)$$

The combined tip pullback is then calculated. If D is 40 nm and $w_s$ is 10 nm, as above, and $D_{tR}$ is 10 nm, then $$D-D_{tR}+(\text{NtipR}-\text{NsegR})w_s=40\ \text{nm}-(10\ \text{nm})+(5-4)10\ \text{nm}=40\ \text{nm tip pullback} \quad (10)$$

Figure 6:
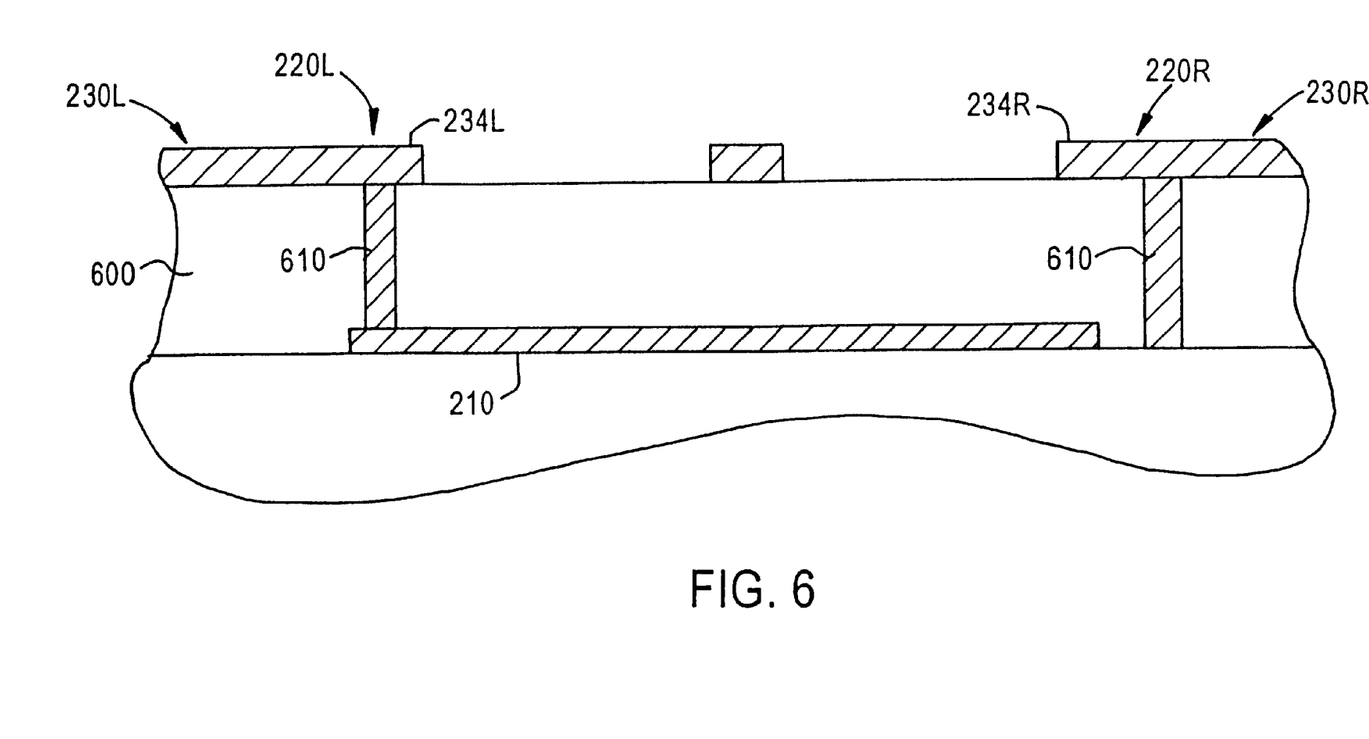
FIG. 6 is a cross-sectional view of a semiconductor device having a test structure according to an embodiment of the present invention.

In another embodiment of the present invention illustrated in FIG. 6, the shorting bar 210 and ladder conductors 220L, 200R of FIG. 2 are both part of first and second metal conductive layers (not shown), with a dielectric layer 600 between them. Some or all of segments 230L, 230R contact vias 610 which extend from the segment bases; e.g., segment bases 234L, 234R, through dielectric layer 600 towards shorting bar 210. Using the above-disclosed methodology (i.e., the steps of FIG. 4), it can be determined where vias 610 contact shorting bar 210, thereby indicating the alignment of the metal layers.

The inventive ladder-type electrical alignment test structure measures alignment with greater accuracy than conventional resistor divider type structures because the resistance of each of its segments is significant, yielding more reliable measurements, and because it is sized according to actual circuitry. Furthermore, because it closely resembles device circuitry in size and shape, the present invention enables determination of CD variation and tip pullback. The inventive structure and methodology also provides superior flexibility, enabling the user to compare the alignment of any two conductive layers that are electrically connected, including non-consecutive layers.

The present invention is applicable to the manufacture of various types of semiconductor devices, particularly high-density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An electrical test structure comprising:
    a shorting bar of a first conductive layer disposed on a semiconductor substrate, the shorting bar having a base width, a top width less than the base width, and a pair of symmetrical opposing sides, each side comprising a predetermined number of steps and joining the base width and the top width; and
    a pair of ladder conductors of a second conductive layer disposed on the semiconductor substrate and aligned with the first conductive layer, the ladder conductors being symmetrical to each other about a center line, each ladder conductor comprising a plurality of serially connected segments arranged corresponding to the steps of the shorting bar, each segment having an inner end adjacent to one of the steps of the shorting bar, the inner ends of the segments being equidistant from the center line;
    wherein the shorting bar is disposed substantially between the ladder conductors; wherein the ladder conductors are spaced apart from each other such that when the first and second conductive layers are aligned in a predetermined manner, the shorting bar is substantially axially aligned with the center line, the inner end of a predetermined segment of one of the ladder conductors makes electrical contact with one of the steps on one side of the shorting bar, and a corresponding segment of the other ladder conductor makes electrical contact with a corresponding step on the opposing side of the shorting bar; and wherein the ladder conductors are spaced apart from each other such that when the shorting bar is not substantially axially aligned with the center line, the inner end of a predetermined segment of one of the ladder conductors makes electrical contact with one of the steps on one side of the shorting bar, and a corresponding segment of the other ladder conductor does not make electrical contact with a corresponding step on the opposing side of the shorting bar.

2. The electrical test structure of claim 1, wherein each of a plurality of adjacent segments of each ladder conductor is substantially U-shaped and comprises a pair of legs and a base, and wherein the base includes the inner end of the segment.

3. The electrical test structure of claim 1, wherein each of a plurality of adjacent segments of each ladder conductor is substantially U-shaped and comprises a pair of legs and a base, and each of a plurality of segments of at least one of the ladder conductors further comprises a segment tip extending from the base towards the shorting bar, wherein the segment tip includes the inner end of the segment.

4. The electrical test structure of claim 3, wherein the steps of the shorting bar corresponding to the segment tips each comprise a shorting bar tip extending towards the corresponding segment tip.

5. The electrical test structure of claim 1, wherein the ladder conductors comprise polysilicon or doped silicon.

6. The electrical test structure of claim 1, wherein the shorting bar comprises polysilicon or metal.

7. The electrical test structure of claim 1, wherein each of the pair of ladder conductors has a first terminal and a second terminal for contacting the ladder conductor to measure its electrical resistance, and the segments are between the first and second terminals.

8. The electrical test structure of claim 7, wherein the first terminals of the ladder conductors are electrically connected to each other.

9. The electrical test structure of claim 1, wherein the steps of the shorting bar are substantially equal in width.

10. The electrical test structure of claim 1, wherein a dielectric layer is disposed between the first and second conductive layers, and wherein each of a plurality of adjacent segments of each ladder conductor is substantially U-shaped and comprises a pair of legs and a base, and each of a plurality of segments of at least one of the ladder conductors further comprises a segment via extending from the base through the dielectric layer towards the shorting bar, wherein the segment via includes the inner end of the segment.

11. The electrical test structure of claim 10, wherein the shorting bar comprises a metal layer.

12. A method of determining whether first and second conductive layers formed on a semiconductor substrate are aligned in a predetermined manner, the method comprising:

(a) forming the first layer to have a shorting bar, the shorting bar having a base width, a top width less than the base width, and a pair of symmetrical opposing sides, each side comprising a predetermined number of steps and joining the base width and the top width;

(b) forming the second layer to have a pair of ladder conductors, the ladder conductors being symmetrical to each other about a center line, each ladder conductor comprising a pair of terminals and a plurality of serially connected segments between the terminals, the segments arranged corresponding to the steps of the shorting bar, each segment having an inner end adjacent to one of the steps of the shorting bar, the inner ends of the segments being equidistant from the center line;

wherein the shorting bar is formed to be substantially between the ladder conductors;

wherein the ladder conductors are spaced apart from each other such that when the first and second conductive layers are aligned in the predetermined manner, the shorting bar is substantially axially aligned with the center line, the inner end of a predetermined segment of one of the ladder conductors makes electrical contact with one of the steps on one side of the shorting bar, and a corresponding segment of the other ladder conductor makes electrical contact with a corresponding step on the opposing side of the shorting bar; and wherein the ladder conductors are spaced apart from each other such that when the shorting bar is not substantially axially aligned with the center line, the inner end of a predetermined segment of one of the ladder conductors makes electrical contact with one of the steps on one side of the shorting bar, and a corresponding segment of the other ladder conductor does not make electrical contact with a corresponding step on the opposing side of the shorting bar;

(c) measuring the electrical resistance of each ladder conductor between the terminals; and (d) comparing the electrical resistance of the ladder conductors to determine the alignment of the first and second layers.

13. The method of claim 12, comprising:

determining that the shorting bar is substantially axially aligned with the center line when the electrical resistances of the ladder conductors are substantially equal to each other; and determining that the shorting bar is not substantially axially aligned with the center line when the electrical resistances of the ladder conductors are not substantially equal to each other.

14. The method of claim 12, comprising:

forming the steps of the shorting bar to be substantially equal in width;

comparing the electrical resistances of the ladder conductors, when the electrical resistances of the ladder conductors are not substantially equal, to determine the number of segments of each of the ladder conductors not making electrical contact with the respective steps of the shorting bar; and determining the deviation of the alignment of the first and second layers from the predetermined alignment based on the number of segments of each of the ladder conductors not making electrical contact with the respective steps of the shorting bar, and the width of the steps of the shorting bar.

15. A method of inspecting a layer formed on a semiconductor substrate, the method comprising:

(a) forming a first conductive layer to have a first shorting bar, the first shorting bar having a base width, a top width less than the base width, and a pair of symmetrical opposing sides, each side comprising a predetermined number of steps of equal width and joining the base width and the top width;

(b) forming a second conductive layer to have a pair of ladder conductors, the ladder conductors being symmetrical to each other about a center line, each ladder conductor comprising a first pair of terminals and a plurality of serially connected segments between the terminals, the segments arranged corresponding to the steps of the shorting bar, each segment having an inner end adjacent to one of the steps of the shorting bar, the inner ends of the segments being equidistant from the center line;

wherein the first shorting bar is formed to be substantially between the pair of ladder conductors;

wherein the pair of ladder conductors are spaced apart from each other such that when the first and second conductive layers are aligned in a predetermined manner, the first shorting bar is substantially axially aligned with the center line, the inner end of a first predetermined segment of one of the ladder conductors makes electrical contact with one of the steps on one side of the first shorting bar, a corresponding segment of the other ladder conductor makes electrical contact with a corresponding step on the opposing side of the first shorting bar, and a second predetermined segment of each of the ladder conductors is a predetermined distance from a step of the first shorting bar; and wherein the ladder conductors are spaced apart from each other such that when the first shrting bar is not substantially axially aligned with the center line, the inner end of a predetermined segment of one of the ladder conductors makes electrical contact with one of the steps on one side of the first shorting bar, and a corresponding segment of the other ladder conductor does not make electrical contact with a corresponding step on the opposing side of the first shorting bar;

(c) forming the first layer to have a second shorting bar substantially identical to the first shorting bar;

(d) forming the second layer to have a single ladder conductor comprising a second pair of terminals and a plurality of serially connected segments between the terminals, the segments arranged corresponding to the step of the second shorting bar, each segment having an inner end adjacent to one of the steps of the shorting bar, wherein each of a plurality of adjacent segments is substantially U-shaped and comprises a pair of legs and a base, and each of the plurality of segments further comprises a segment tip extending from the base towards the shorting bar, wherein the segment tip includes the inner end of the segment and has a design length;

wherein the single ladder conductor is spaced apart from the second shorting bar such that one of the segment tips of the single ladder conductor is a second predetermined distance from a corresponding step of the second shorting bar when the first and second layers are aligned in the predetermined manner;

(e) measuring the electrical resistance of the single ladder conductor between the second terminals, and measuring the electrical resistance of a corresponding one of the first pair of ladder conductors between the first terminals;

(f) determining the number of segments of the single ladder conductor not making electrical contact with the respective steps of the second shorting bar based on the electrical resistance of the single ladder conductor, and determining the number of segments of a corresponding one of the pair of ladder conductors not making electrical contact with the respective steps of the first shorting bar; and (g) determining a deviation from the design length of the segment tips based on the step width, the first and second predetermined distances, and the number of segments of the single ladder conductor and corresponding one of the pair of ladder conductors not making electrical contact with the second and first shorting bars, respectively.

16. The method of claim 15, further comprising:

forming the steps of the second shorting bar corresponding to the segment tips with shorting bar tips extending towards the corresponding segment tip, the shorting bar tips having a design length; and determining the combined deviation from the design lengths of the segment tips and the shorting bar tips.

* * * * *